(12) United States Patent
Khan et al.

(10) Patent No.: US 12,160,241 B2
(45) Date of Patent: Dec. 3, 2024

(54) FREQUENCY DOUBLER WITH DUTY CYCLE ESTIMATOR, DUTY CYCLE CORRECTOR, AND T/4 DELAY GENERATOR

(71) Applicant: Silicon Laboratories Inc., Austin, TX (US)

(72) Inventors: Patan Imran Khan, Andhra Pradesh (IN); Hariharan Ganapathy Raman, Kerala (IN); Rahul Reghu, Kerala (IN)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/295,376

(22) Filed: Apr. 4, 2023

(65) Prior Publication Data

US 2024/0339996 A1 Oct. 10, 2024

(51) Int. Cl.
H03K 5/156 (2006.01)
H03L 7/081 (2006.01)

(52) U.S. Cl.
CPC ......... *H03K 5/1565* (2013.01); *H03L 7/0814* (2013.01)

(58) Field of Classification Search
None
See application file for complete search history.

(56) References Cited

U.S. PATENT DOCUMENTS

| 7,484,113 | B1 * | 1/2009 | Plants | G06F 1/10 |
| | | | | 713/500 |
| 8,878,582 | B2 * | 11/2014 | Hsueh | H03K 3/017 |
| | | | | 327/175 |
| 10,840,897 | B1 | 11/2020 | Rafi et al. | |
| 10,911,165 | B1 * | 2/2021 | Albel | H03K 5/00006 |
| 2009/0279895 | A1 * | 11/2009 | Takahara | H03K 5/1565 |
| | | | | 327/116 |

* cited by examiner

*Primary Examiner* — Cassandra F Cox
(74) *Attorney, Agent, or Firm* — Zagorin Cave LLP (57) ABSTRACT

A clock doubler circuit doubles the frequency of an input clock signal. The input clock signal is supplied to a duty cycle corrector (DCC) circuit, which generates a DCC output signal having a duty cycle corrected to fifty percent and has a frequency that equals the input frequency. A T/4 delay circuit receives the input clock signal and generates a T/4 delay output signal that has a delay of T/4 from the DCC output signal and has the same frequency as the input clock signal. T/4 is one quarter of a period of the input clock signal. An XOR gate combines the DCC output signal and the T/4 delay output signal to generate an output clock signal that is twice the frequency of the input clock signal. A duty cycle estimator generates correction factors used to generate the T/4 delay output signal and the DCC output signal.

20 Claims, 11 Drawing Sheets

FREQUENCY DOUBLER WITH DUTY CYCLE ESTIMATOR, DUTY CYCLE CORRECTOR, AND T/4 DELAY GENERATOR

BACKGROUND

Field of the Invention

This disclosure relates to generation of clock signals, and more particularly to doubling the frequency of an input clock signal.

Description of the Related Art

Figure 1A:
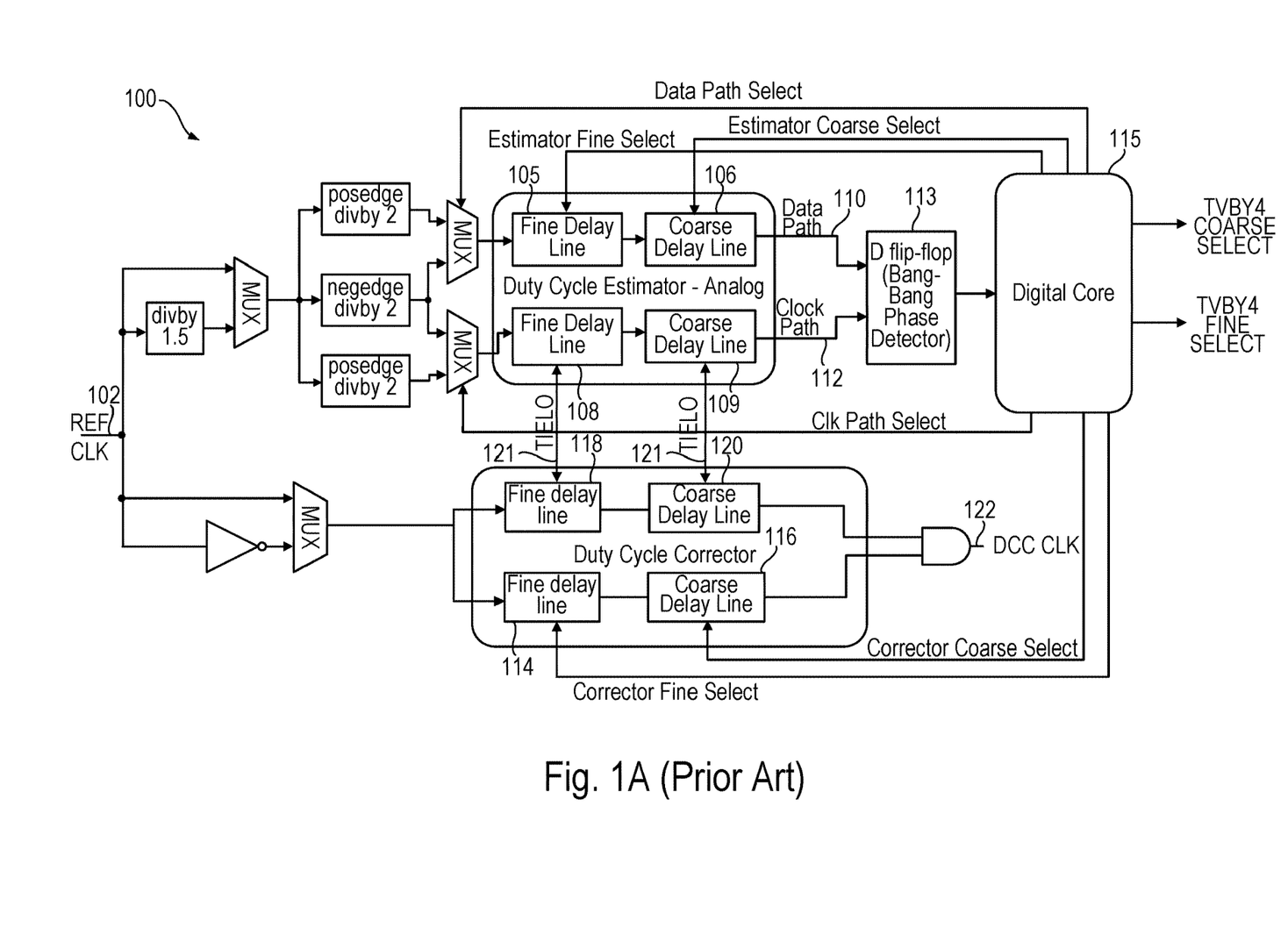
FIG. 1A illustrates a portion of a prior art clock doubling circuit.
Figure 1B:
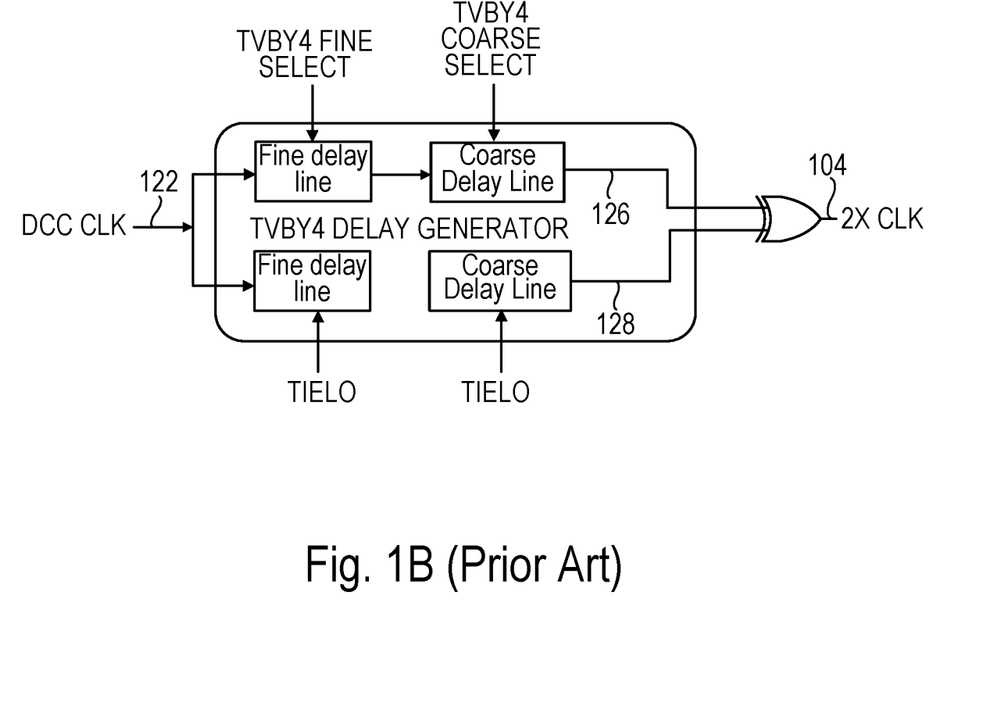
FIG. 1B illustrates another portion of the prior art clock doubling circuit.

FIGS. 1A and 1B illustrate a prior art system 100 used to double the frequency of an input clock signal. The system takes an input clock signal (REF CLK) 102 shown in FIG. 1A and supplies an output clock signal (2×CLK) 104 shown in FIG. 1B. The system 100 includes an estimator that provides an estimate of the duty cycle with a 50% duty cycle being the desired duty cycle. The estimator uses the delay lines 105, 106, 108, and 109 to generate clock signals with different phases and uses the phase detector 113 to compare the phase difference between the data path clock signal 110 and the clock path clock signal 112 as explained more fully herein using the digital core 115 as part of a delay lock loop. The phase difference is used to generate an estimate as described more fully herein. That estimate is provided to a duty cycle corrector that adjusts delay lines 114 and 116, whose outputs are ANDed together with the output from delay lines 118 and 120 to generate the Duty Cycle Corrector (DCC) clock signal 122. Note that the control signal tie low (TIELO) 121 sets the delay lines 108, 109, 118, and 120 to minimum delay values.

Referring to FIG. 1B, the DCC clock signal 122 is supplied to a delay circuit that generates two clock signals 126 and 128 that are separated by T/4, where T is the period of the input clock signal 102. Those two clock signals are XORed together to generate the output clock signal (2×CLK) 104 having twice the frequency of the REF CLK signal 102.

SUMMARY OF EMBODIMENTS OF THE INVENTION

In order to provide an improved clock doubler, in an embodiment a method for doubling a first frequency of an input clock signal includes supplying the input clock signal to a duty cycle corrector (DCC) circuit and generating a DCC output signal having a duty cycle corrected to a fifty percent duty cycle and having a frequency that equals the frequency of the input clock signal. The method further includes supplying the input clock signal to a T/4 delay generator circuit and generating a T/4 delay output signal that has a delay of T/4 from the DCC output signal. T/4 corresponds to one quarter of a period of the input clock signal. The DCC output signal is XORed with the T/4 delay output signal to generate an output clock signal having a second frequency that is double the first frequency and has an output clock duty cycle of fifty percent.

In another embodiment an apparatus for doubling a first frequency of an input clock signal includes a duty cycle estimator having a delay locked loop that generates a duty cycle correction indication. A duty cycle corrector (DCC) circuit supplies a DCC output signal having a duty cycle corrected to fifty percent. The DCC circuit receives the input clock signal and the duty cycle correction indication. A T/4 delay generator circuit supplies a T/4 delay output signal that is delayed by T/4 from the DCC output signal. The T/4 delay generator circuit also receives the input clock signal, where T/4 corresponds to one quarter of a period of the input clock signal. An XOR circuit XORs the DCC output signal and the T/4 delay output signal to generate an output clock signal having a second frequency that is double the first frequency and has a fifty percent duty cycle.

In another embodiment a method for doubling a frequency of an input signal includes supplying the input signal to a duty cycle corrector (DCC) circuit and generating a DCC output signal and supplying the input signal to a T/4 delay generator circuit and generating a T/4 delay output signal. The DCC output signal and the T/4 delay output signal are supplied to a selector circuit and selecting the DCC output signal is selected to be supplied to a duty cycle estimator to calibrate the DCC circuit and the T/4 delay output signal is selected to be supplied to the duty cycle estimator to calibrate the T/4 delay generator circuit. After calibration of the DCC circuit and the T/4 delay generator circuit, the DCC output signal is selected to be supplied to the duty cycle estimator and the duty cycle estimator supplies a duty cycle correction indication to the DCC circuit and the DCC circuit generates a DCC output signal having a duty cycle corrected to a fifty percent duty cycle and having a frequency that equals the frequency of the input signal. After calibration, the duty cycle estimator supplies a T/4 indication and the duty cycle correction indication to the T/4 delay generator circuit and T/4 delay generator circuit generates a T/4 delay output signal having a fifty percent duty cycle and having a delay of T/4 from the DCC output signal, where T/4 corresponds to one quarter of a period of the input signal and having a frequency that equals the frequency of the input signal. The T/4 delay output signal and the DCC output signal are XORed to generate an output signal having a frequency that is twice the frequency of the input signal and having a fifty percent duty cycle.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The basic principle of embodiment(s) described herein is to delay the input clock and XOR the delayed version of the input clock to generate an output clock with a doubled frequency. That works best when the duty cycle of the input clock is close to 50%. Otherwise the frequency doubling results in an unwanted large spurious tone in the output spectrum. A digital delay locked loop (DLL) based circuit estimates the duty cycle and supplies a correction signal to correct the duty cycle to 50%. Low power consumption is one major motivation for the frequency doubler described herein. Thus, the duty cycle estimator can be turned off once the duty cycle estimation is done, hence saving power.

Figure 2:
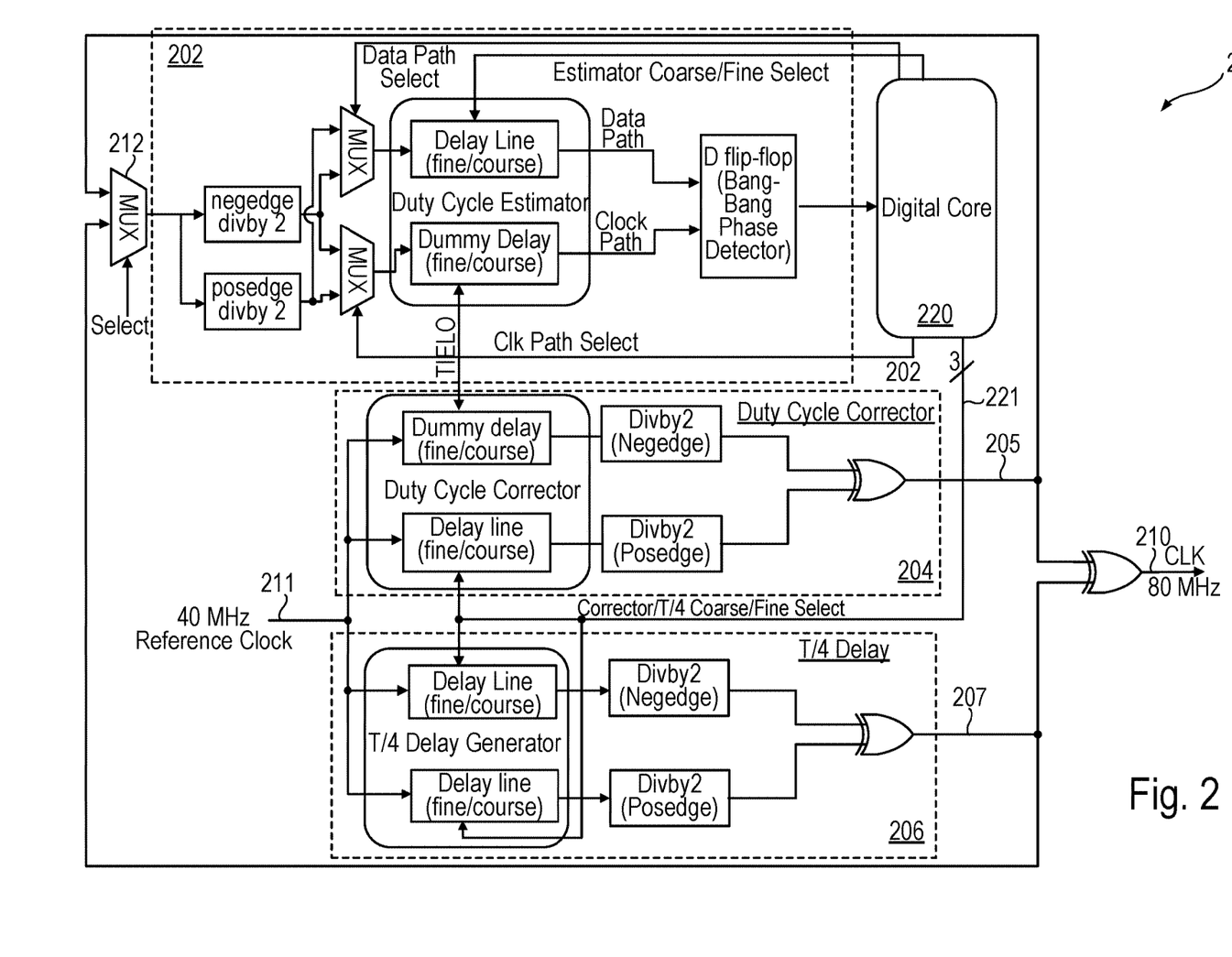
FIG. 2 illustrates a block diagram of an embodiment of a clock doubling system.

In an embodiment the frequency doubler generates a low jitter 80 MHz output clock 210 from an input reference clock 211 generated by a 40 MHz crystal oscillator. The 80 MHz output clock is used, e.g., as a reference clock for a radio frequency (RF) all digital phase-locked loops (ADPLL) so that time-to-digital converter (TDC) noise can be reduced by 3 dB compared to the 40 MHz clock. Of course, other embodiments supply the output clock signal with a doubled frequency to other applications and/or use other frequencies for the input clock and the output clock.

FIG. 2 illustrates an embodiment of a frequency doubler 200 having three major blocks, including the duty cycle estimator 202, the duty cycle corrector 204, and the T/4 delay generator 206. The output 205 of the duty cycle corrector 204 and the output 207 of the T/4 delay generator are XORed together to generate the frequency doubled output clock signal 210. The duty cycle estimator 202 estimates the duty cycle of the input to the estimator and generates a duty cycle correction indication that is used to bring the clock signal generated by the duty cycle corrector to a 50% duty cycle. The duty cycle estimator 202 is a delay-locked loop (DLL) based estimator that estimates the duty cycle of the clock signals used to generate the doubled output clock signal as explained further herein.

The duty cycle corrector (DCC) 204 receives the input reference clock signal 211 and generates a clock signal with a duty cycle corrected to 50% using the duty cycle correction indication. The DCC generated output clock signal 205 has the same frequency as the input reference clock signal 211. A 50% duty cycle clock is important for systems such as double data rate synchronous dynamic random access memory (DDR-SDRAM), high-speed analog-to-digital converters (ADCs), and half/quarter rate serial link transceivers and to avoid undesired spurs as described previously.

The T/4 delay generator 206 also receives the reference clock signal 211 as its input and generates the output clock signal 207 that is delayed by T/4 from the DCC output clock signal 205 supplied by the duty cycle corrector. Thus, e.g., assuming, e.g., a 40 MHz input clock signal, T/4=6.25 ns. The duty cycle estimator, the duty cycle corrector, and the T/4 delay generator utilize identical delay lines, which are described further herein. The digital core 220 supplies three different control words 221 to control the delay lines as described further herein. The three words are a DCC Word to one of the DCC delay lines, a T/4 word to one of the T/4 delay generator delay lines, and a (DCC+T/4) to another one of the T/4 delay generator delay lines.

Figure 3:
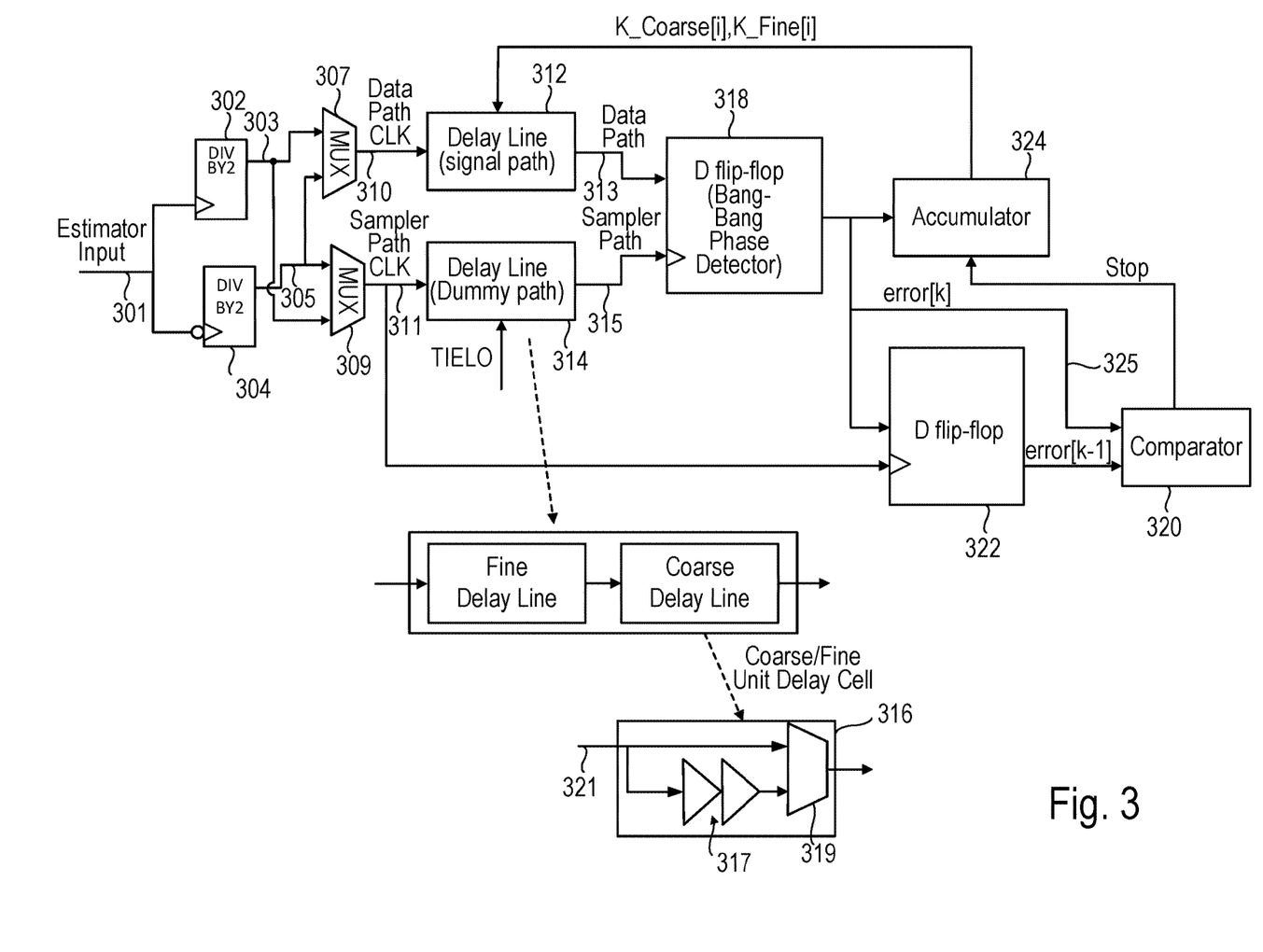
FIG. 3 illustrates additional details of the estimator circuit.

FIG. 3 illustrates additional details of the duty cycle estimator 202. The duty cycle estimator generates two clock signals from the input signal 301 to the duty cycle estimator. The phase difference between the two clocks signals 303 and 305 is used to estimate the duty cycle of the duty cycle estimator input clock signal 301. The input clock signal 301 to the estimator from multiplexer 212 (shown in FIG. 2) is provided to divide by two circuit 302 and 304. The divider circuit 302 triggers off the positive edge of clock signal 301 and generates the clock signal 303. The divider circuit 304 triggers off the negative edge of input signal 301 and generates a second clock signal 305. The divide by two circuits 302 and 304 supply the multiplexer circuits 307 and 309. The multiplexer circuits select the clock signal 303 to be the data path clock signal 310 for a first iteration and the multiplexer 309 selects the clock signal 305 to be the sampler path (also referred to herein as dummy path) clock signal 311 for the first iteration. For the second iteration the multiplexers 307 and 309 select respectively signals 305 and 303 as their outputs. The data path 310 supplies the delay line 312 and the dummy path (sampler path) 311 supplies the delay line 314. The delay line 312 supplies delay line output 313 and delay line 314 supplies delay line output 315. In an embodiment, each delay chain includes 64 coarse and 64 fine delay cells. Of course, other embodiments use other numbers of delay cells. The unit delay cell 316 forming each delay cell includes delay elements 317 and a multiplexer 319. If no delay is selected for the particular unit delay cell the input signal 321 to the delay cell is selected as the multiplexer output to be supplied to the next delay cell. The delay lines supply their outputs to bang-bang phase detector 318 that indicates whether the phase difference is early or late. Note that for phase comparison the dummy delay line 314 negates the multiplexer delay in the signal path delay line 312 since both delay lines have the same multiplexer delays. The delay line 314 receives the control signal TIELO (tie low) that causes the multiplexer 319 in each delay cell to select the input to the cell as the output, thereby minimizing the delay through the delay line.

Figure 4:
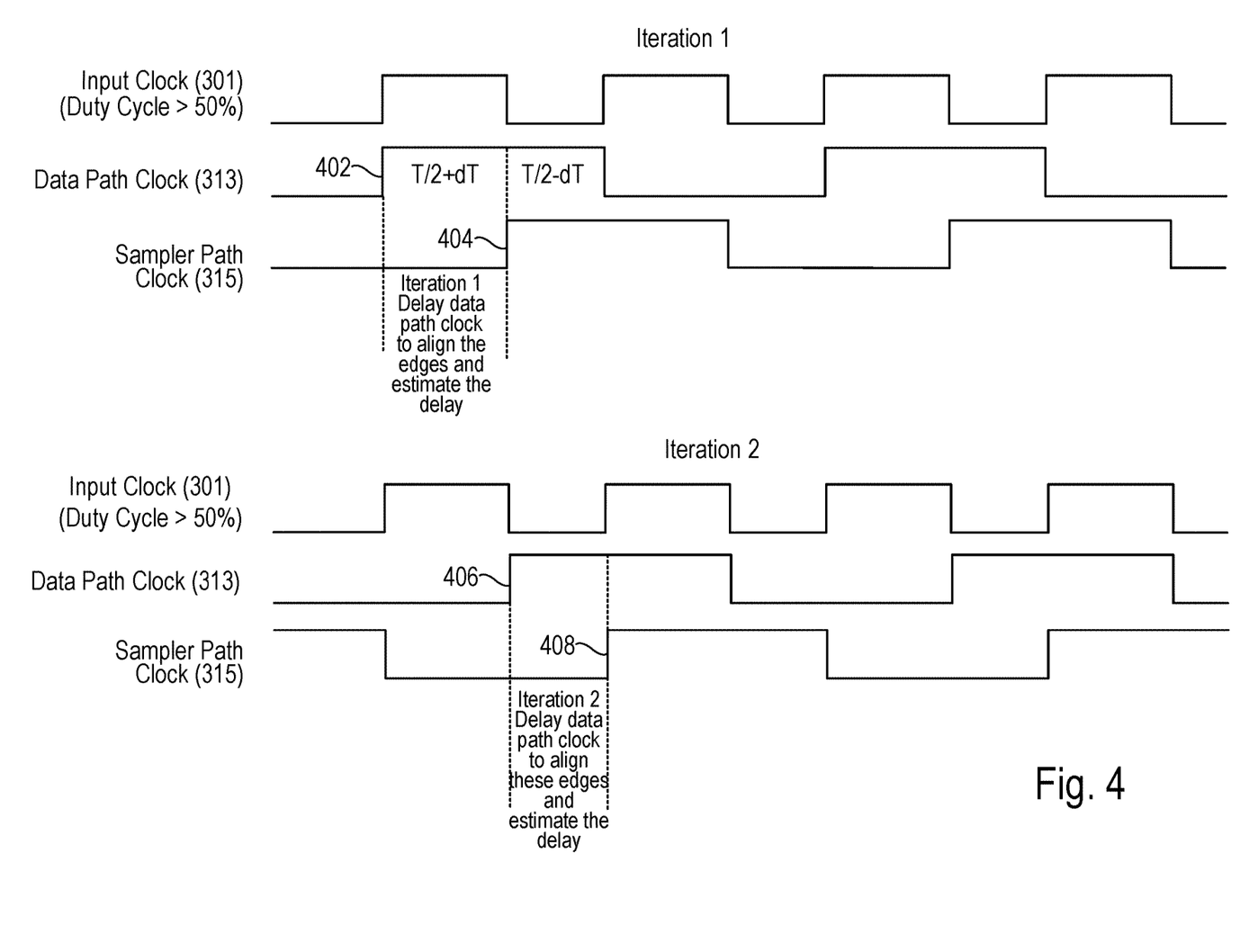
FIG. 4 is a timing diagram illustrating the operation of the estimator circuit shown in FIG. 3.

The estimation of the duty cycle takes place in two iterations. Referring to FIGS. 3 and 4, the timing diagram illustrates the operation of the two iterations. Assume the input clock 301 has a duty cycle >50%. For the first iteration the data path clock 313 supplied by delay line 312, sampled by the positive edge of input clock, has an edge 402 that occurs first. The sampler path clock 315 supplied by delay line 314 rising edge 404 occurs at T/2+dT after the rising edge of the input clock signal 301, where T/2 is half period of the input clock signal and dT represents the duty cycle error, i.e., the amount the positive portion of the input clock signal is greater than T/2. Note that FIG. 4 ignores the delay attributable to the input multiplexers and the multiplexers in the delay lines. Thus, the input clock signal 301 is shown in FIG. 4 as if it went through a dummy delay line as well. During iteration 1, the delay locked loop adjusts the delay of delay line 312 so the edge 402 of data path clock signal 313 aligns with the edge 404 of the sampler path clock 315. In an embodiment, control logic for the delay locked loop uses a binary search algorithm to determine the correct coarse and fine delay amounts to align the data path and sampler path output clocks. That amount of delay corresponds to T/2+dT.

During the second iteration, the multiplexer 307 selects the negative edge sample for the data path 310 and multiplexer 309 selects the positive edge sample for the dummy (sampler) path 311. Referring again to FIG. 4, the data path clock 313 rising edge 406 occurs on the falling edge of the input clock 301. The rising edge 408 of the sampler path clock 315 occurs on the rising edge of the input clock signal 301. The difference between rising edges 406 and 408 represent (T/2−dT). During the second iteration, the controller supplies coarse and fine delay signals to delay line 312 to cause the rising edge 406 of the data path clock signal 313 to align with the rising edge 408. In an embodiment, control logic for the delay locked loop uses a binary search algorithm to determine the correct coarse and fine delay amounts to align the data path and sampler path output clocks. That delay amount corresponds to T/2−dT. If the duty cycle is less than 50% the multiplexers 307 and 309 select the opposite clock signals for the first and second iterations. During an initial estimation, the system does not know whether the clock duty cycle is >/<50%. After the initial estimation is completed, the on time and off time values provide that information. That information can be used for the DCC and T/4 delay generator. A coarse/fine delay ratio estimation is done to reduce the length of the fine bank. That estimation determines how many words need to be changed in fine to match one coarse word change.

Still referring to FIGS. 3 and 4, comparator 320 compares the current bang-bang output 325 to error[k−1] from flip-flop 322 and supplies the result to the accumulator 324, which accumulates the fine and coarse delay amounts. The binary search algorithm uses the comparator to determine whether the selected delay resulted in the phase being early or late. At the end of the binary search algorithm when a minimum fine delay is changed and the output of the bang-bang phase detector flips polarity, the comparator determines the correct delay amount has been determined. Of course, many search algorithms and implementations can be used to determine the delay amounts to align the edges for iterations 1 and 2.

The fine and coarse delays determined in iterations 1 and 2 are used to compute both the amount of duty cycle correction to be applied and the word required to generate the T/4 delay. The duty cycle correction computation is:

Input Duty Cycle(DC)Mismatch=[(Coarse Word+Fine Word)@Iteration1−(Coarse Word+Fine Word)@Iteration2]/2.

The input DC mismatch value represents the duty cycle error (difference from 50%) and is applied to the delay line of the duty cycle corrector (DCC) as the DCC Word. The DCC Word contains the coarse and fine values to achieve the desired duty cycle correction. The T/4 calculation is:

T/4=[(Coarse Word+Fine Word)@Iteration1+(Coarse Word+Fine Word)@Iteration2]/4.

The T/4 values (coarse and fine delay) are applied to the T/4 delay generator circuit 206.

Figure 5:
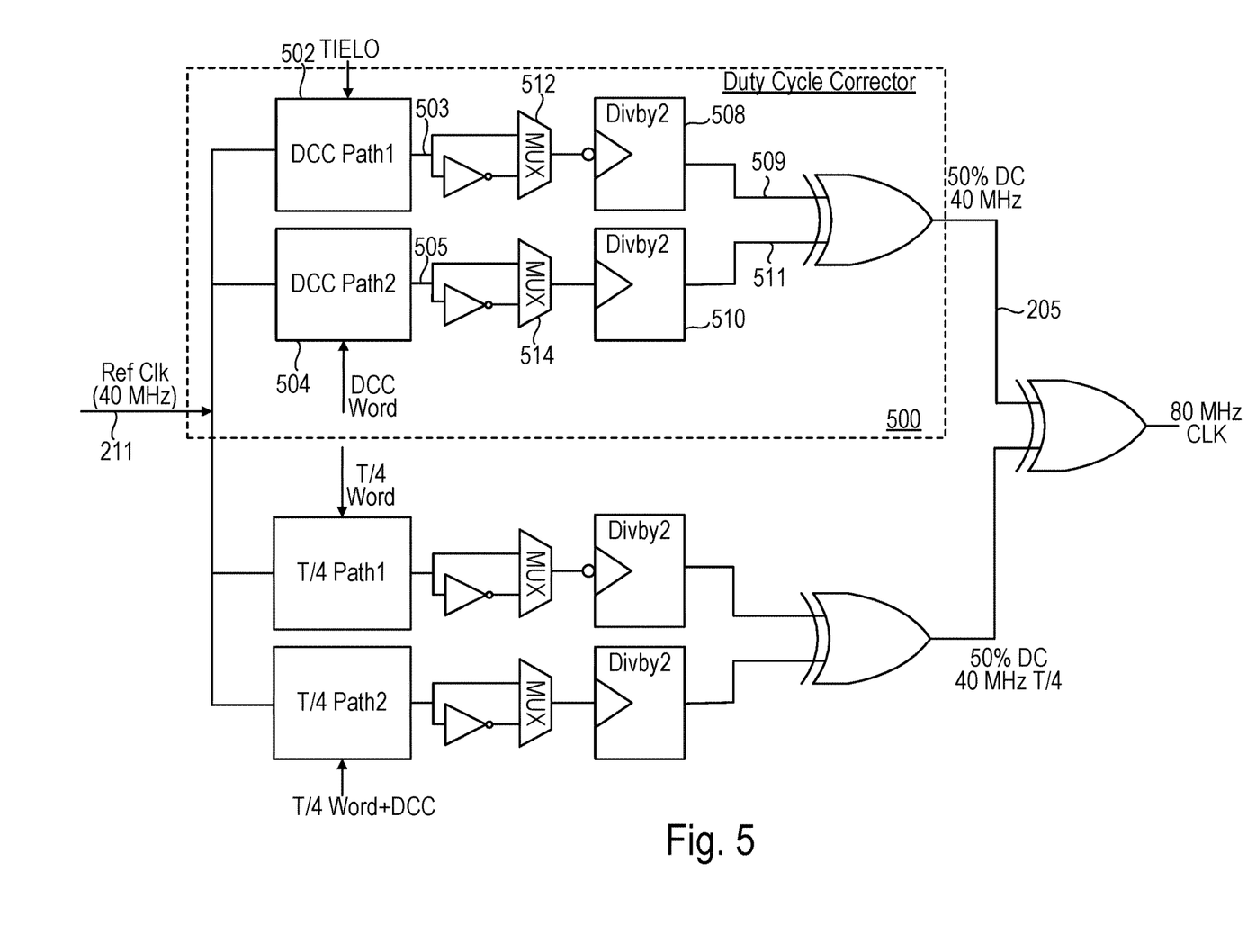
FIG. 5 illustrates additional details of an embodiment of the duty cycle corrector circuit.

FIG. 5 illustrates an embodiment of the duty cycle corrector (DCC) circuit 500. The DCC circuit 500 includes a delay line 502 (DCC Path 1) and the delay line 504 (DCC Path 2). The delay lines 502 and 504 receive the reference clock signal 211, which in an embodiment is a 40 MHz signal from a crystal oscillator. The delay line 502 functions as the dummy delay line and receives the control signal TIELO to minimize the delay through the delay lines. The DC mismatch (DCC word) estimated by the estimator is applied to the delay line 504 (DCC Path2) of the DCC circuit 500 to set the delay for the delay line. The DCC word corrects the duty cycle error (DC mismatch) determined by the duty cycle estimator. If the DC mismatch in duty cycle is for a duty cycle >50%, then the path1 divider 508 works on the negative edge and the path2 divider 510 works on the positive edge. If the DC mismatch in duty cycle is for a duty cycle <50%, then the path1 divider 508 works on the positive edge and the path2 divider 510 works on the negative edge. Multiplexers 512 and 514 select the inputs to the divider circuits. The outputs 509 and 511 of the Path1 divider and the Path2 divider are XORed to get an output clock signal 205 with the same frequency as the input clock signal and with a 50% duty cycle. Thus, with a 40 MHz reference clock signal, the output clock signal 205 is also 40 MHz.

Figure 6:
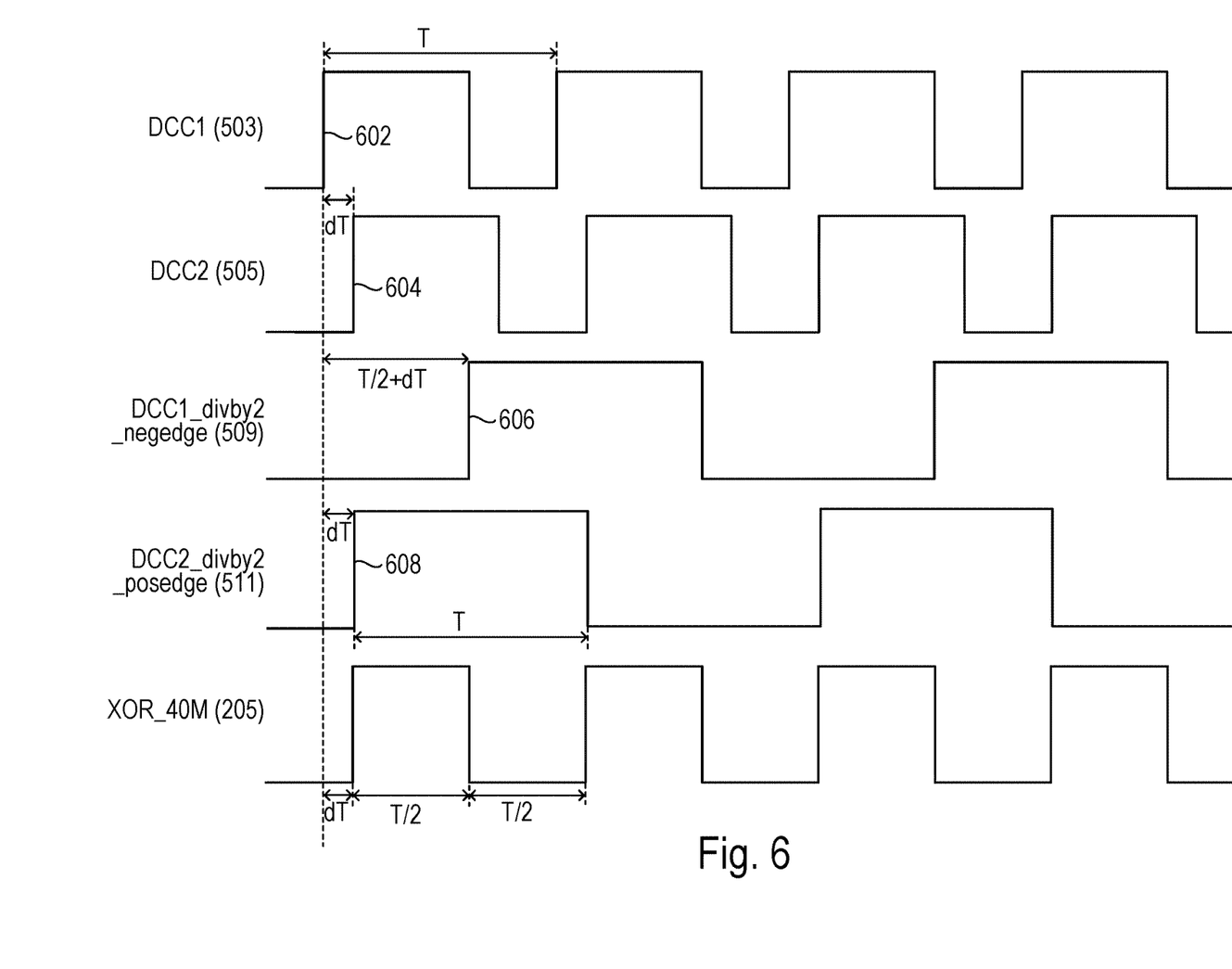
FIG. 6 is a timing diagram illustrating the operation of the duty cycle corrector circuit.

FIG. 6 is a timing diagram illustrating the operation of the DCC circuit 500 assuming the duty cycle of the reference clock signal 211 is greater than 50%. The rising edge 602 of clock signal 503 supplied from the delay line 502 occurs first. The rising edge of clock signal 505 from delay line 504 occurs at 604, which is a delay corresponding to dT from the rising edge 602. The DCC Word supplied to the delay line 504 specifies the coarse and fine delays corresponding to dT. The rising edge 606 of the DCC1 signal 509 (after dividing by the negative edge occurs) at T/2+dT after the rising edge 602. The rising edge 608 of clock signal 511 after dividing by two with the positive edge occurs after a delay dT from the rising edge 602. The clock signals 509 and 511 are XORed together to generate the output clock signal 205 that is delayed from the rising edge 602 by dT and has a 50% duty cycle.

Figure 7:
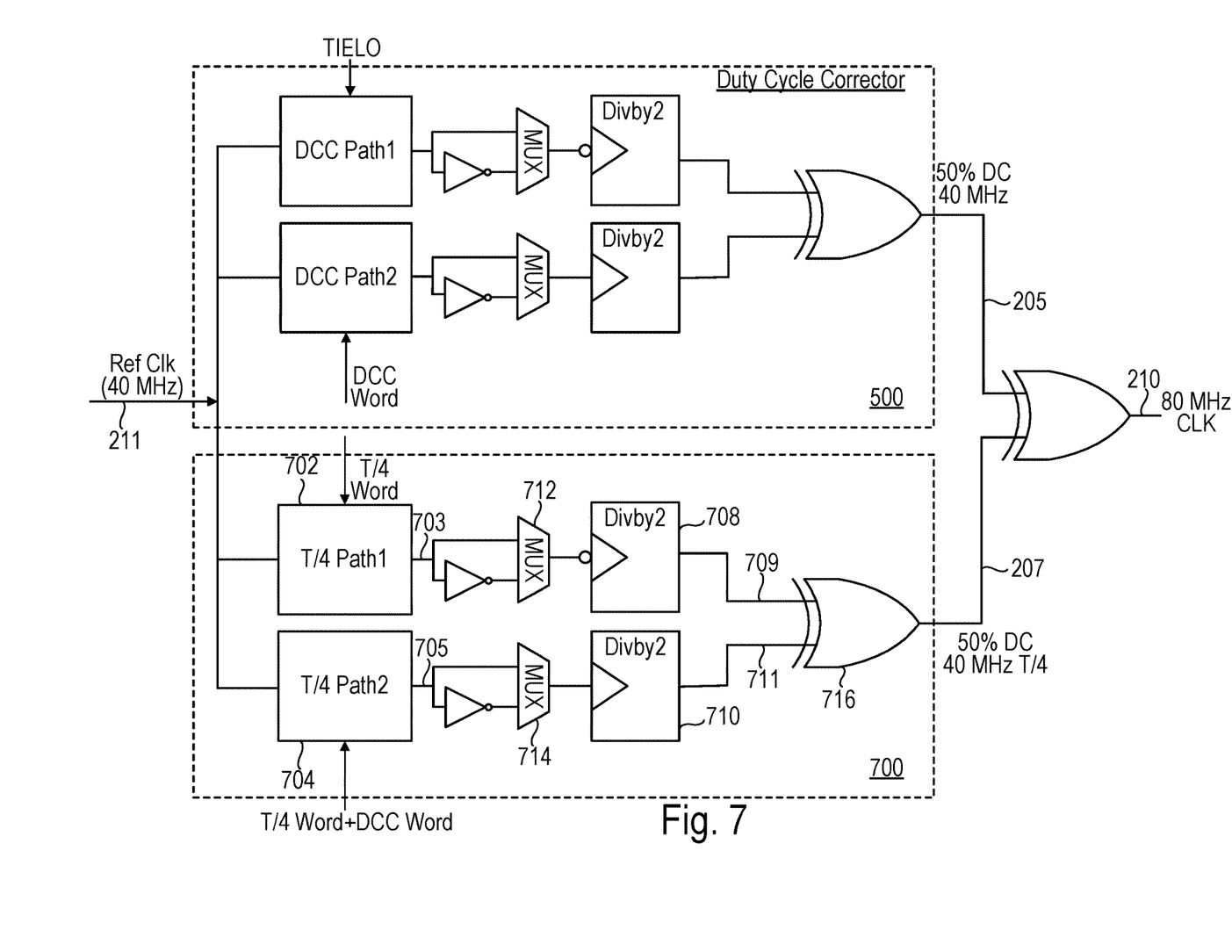
FIG. 7 illustrates additional details of an embodiment of the T/4 delay generator circuit.

FIG. 7 illustrates the T/4 generator circuit 700 (also referred to herein as T by 4). The T/4 generator circuit 700 includes a delay line 702 (T/4 Path 1) and the delay line 704 (T/4 Path 2). The delay lines 702 and 704 receive the reference clock signal 211. The T/4 estimate (T/4 Word) is applied to the path1 delay line 702 and (T/4 Word+DCC Word) is applied to the Path2 delay line 704. If the mismatch is for a duty cycle >50%, then the path1 divider 708 works on the negative edge and the path2 divider 710 works on the positive edge. If the duty cycle mismatch is for a duty cycle <50%, then the path 1 divider 708 works on the positive edge and the path2 divider 710 works on the negative edge. Multiplexers 712 and 714 select the inputs to the divider circuits. XOR gate 716 XORs the Path1 and Path2 divider outputs 709 and 711 to generate the clock signal 207 with a 50% duty cycle and delayed by T/4.

Figure 8:
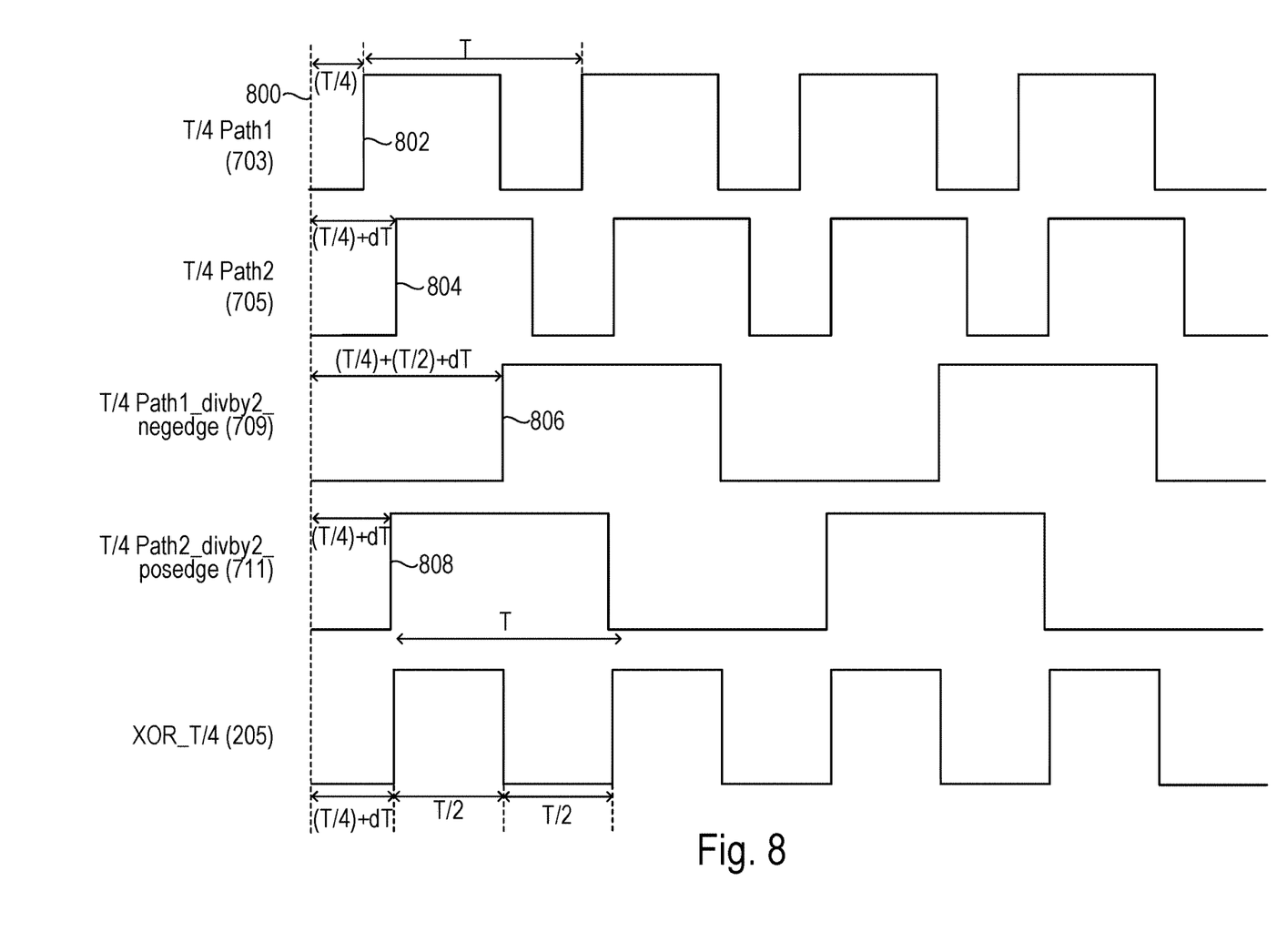
FIG. 8 is a timing diagram illustrating the operation of the T/4 delay generator circuit.

FIG. 8 is a timing diagram illustrating the operation of the T/4 generator circuit 700 assuming the duty cycle of the reference clock signal 211>50%. The rising edge 802 of clock signal 703 supplied from the delay line 702 occurs T/4 after the time indicated at 800. The time 800 corresponds to the rising edge of the reference clock signal plus delays from the multiplexers in the delay circuit. The T/4 Word supplied to the delay line 702 specifies the coarse and fine delays corresponding to dT. The rising edge of clock signal 705 from delay line 704 occurs at 804, which is a delay corresponding to (T/4+dT) from the time 800. The rising edge 806 of the clock signal 709 (after dividing by the negative edge) occurs at (T/4+T/2+dT) after the time 800. The rising edge 808 of clock signal 711 after dividing by two with the positive edge occurs after a delay dT from the rising edge 802. The clock signals 709 and 711 are XORed together to generate the output clock signal 207 that is delayed from 800 by dT+T/4 and has a 50% duty cycle. The DCC 40 MHz clock 205 and the T/4 delayed clock 207 delayed by T/4 from clock 205 are XORed together to generate the 80 MHz clock with a 50% duty cycle.

Figure 9:
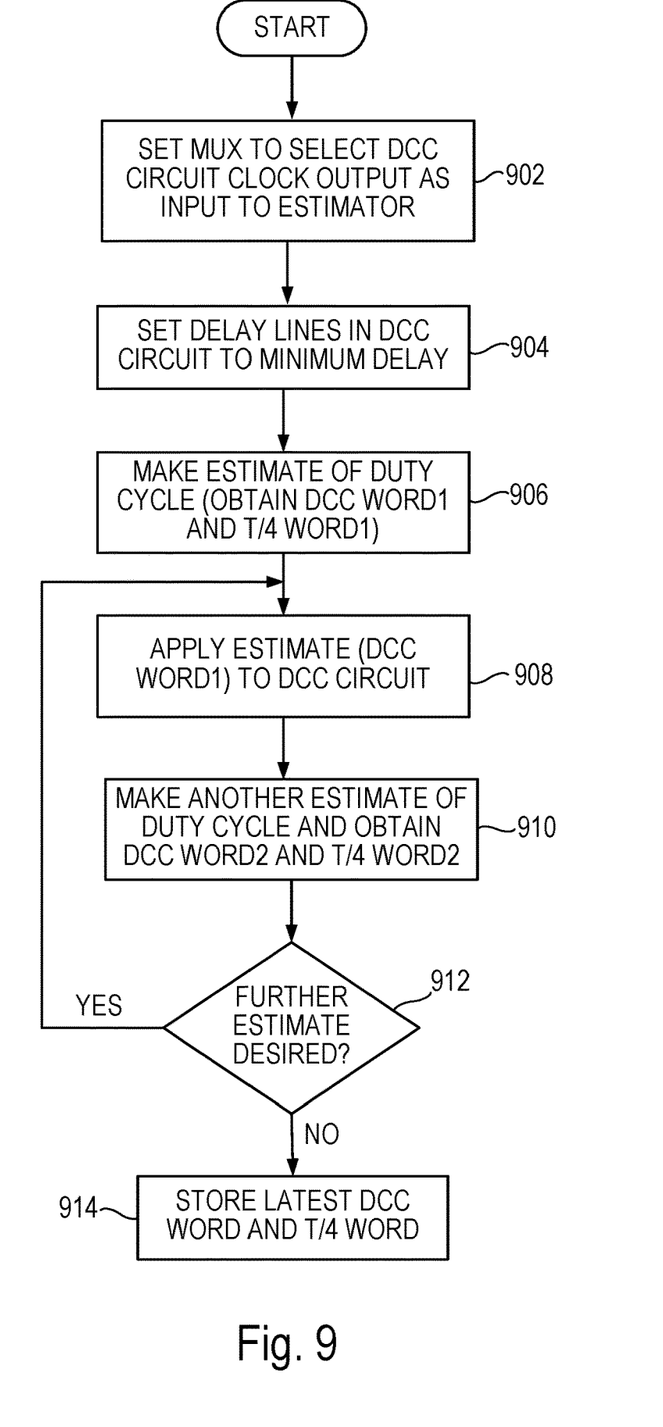
FIG. 9 illustrates a flow diagram of an embodiment for calibrating the DCC circuit.

One advantage of the embodiment illustrated in FIG. 2 compared to FIGS. 1A and 1B is the ability to calibrate the DCC circuit and the T/4 delay generator circuit. Referring to FIGS. 2 and 9, prior to supplying the clock signal 210 operationally, in 902 the digital core 220 controls the multiplexer 212 to select the output 205 from the duty cycle corrector as the input to the duty cycle estimator 202. In 904, the delay lines 502 and 504 (see FIG. 5) in the DCC circuit 204 are set to have the minimum delay. In 906 the duty cycle estimator 202 estimates the duty cycle of the clock supplied by the DCC circuit 204 and generates both a DCC Word 1 and a T/4 Word1 as described in relation to FIGS. 3 and 4. Those values are stored by the digital core in memory within the digital core. In 908 the DCC core supplies the DCC Word1 to the delay line 504 in the DCC circuit and the delay line 502 is tied low (TIELO) to provide no added delay. In 910 the duty cycle estimator makes another estimate of the duty cycle of the clock signal 205 supplied by the DCC circuit 204 with the duty cycle corrected and obtains DCC Word2 and T/4 Word2. In 912, if a further estimate is desired to ensure that both the coarse and fine delays are set as accurately as possible, the flow returns to 908 and the most recent estimate of the DCC Word is applied to the delay line. Once the desired number of DCC Word estimates are made, in 914 the digital core 220 stores the last DCC Word and T/4 Word determined during calibration. The DCC calibration ensures that any offsets associated with the circuits in the DCC circuit are accounted for in generating the DCC Word for duty cycle correction. That is in contrast to just directly estimating the duty cycle error in the reference clock signal directly as shown in FIG. 1A.

Figure 10:
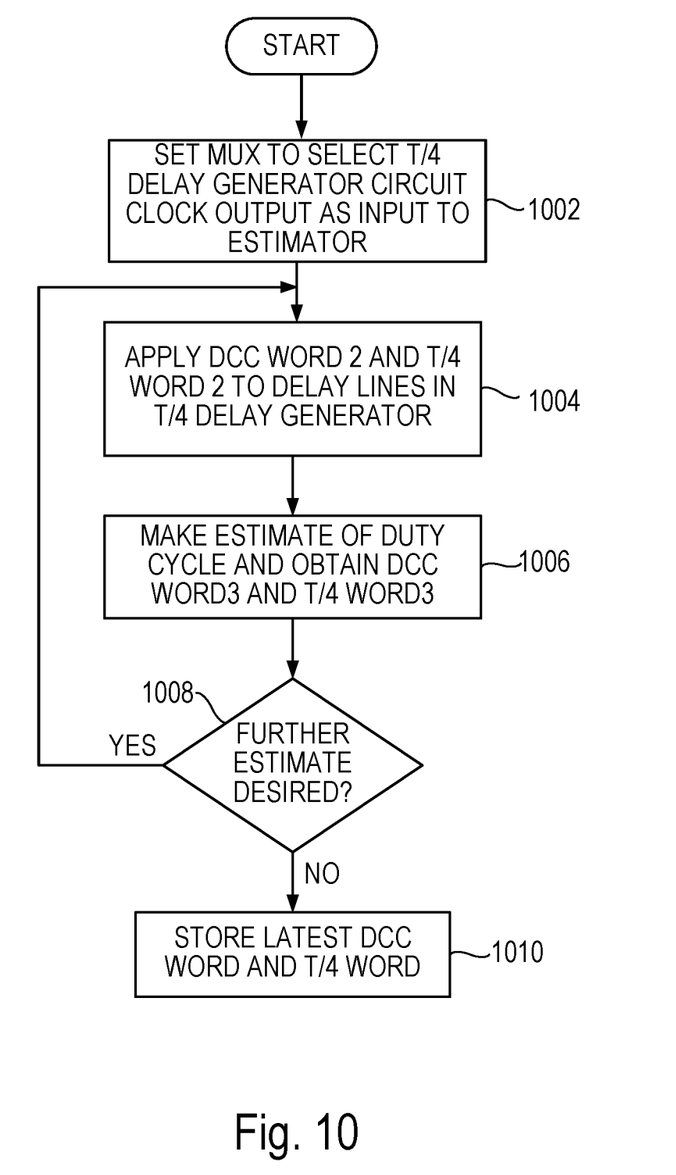
FIG. 10 illustrates a flow diagram of an embodiment for calibrating the T/4 delay generator circuit.

Calibration of the T/4 delay generator 206 occurs after calibration of the DCC circuit 204. FIG. 10 illustrates calibration flow the T/4 delay generator 206. In 1002 the DCC core 220 causes the multiplexer 212 (see FIG. 2) to select the output 207 from the T/4 delay generator circuit 206. In 1004, the delay lines 702 and 704 receive respectively, the most recent T/4 Word and (T/4+DCC Word) estimates. Initially, the most recent estimates are those generated during DCC calibration (e.g., T/4 Word2 and T/4 Word2). In 1006, the duty cycle estimator 202 estimates the duty cycle of the T/4 delay generator 206 output clock signal 207. The duty cycle estimator 202 generates an updated DCC Word3 and T/4 Word3 based on calibration of the T/4 delay generator 206. If additional estimates are desired in 1008 to ensure the coarse and fine settings are as accurate as possible, the flow returns to 1004 and the latest estimates from T/4 delay generator calibration (e.g., DCC Word3 and T/4 Word3) are used. When sufficient estimates have been completed, the final estimates are stored for use operationally. Thus, e.g., T/4 Word3 and DCC Word3 are used operationally for the DCC circuit 204 and the T/4 delay generator circuit 206. In other embodiments, the DCC circuit uses DCC Word2 operationally and the T/4 delay generator circuit 206 uses T/4 Word3 and DCC Word3 operationally. Since those values are stored in memory from the calibration, the estimator circuit can be turned off to save power as the estimator is not 1 needed for generation of the doubled output clock signal 210. Of course, the estimator can be turned on again to recalibrate the delay settings according to the needs of the particular application.

The digital core 220 may be formed by digital circuits 322, 320, 324 following the bang-bang phase detector such as illustrated in FIG. 3 along with other digital circuitry to implement the calibration operations, and search algorithms described herein. In embodiments, the digital core includes a programmed microcontroller to implement such functionality as the search algorithms to determine the DCC Word and the T/4 Word and make adjustments to the DCC Word and the T/4 Word based on the calibration results.

Thus, a clock doubler circuit has been described that doubles the frequency of the input clock signal and provides an output signal with a 50% duty cycle. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A method for doubling a first frequency of an input clock signal comprising:
   supplying the input clock signal to a duty cycle corrector (DCC) circuit and generating a DCC output signal having a duty cycle corrected to a fifty percent duty cycle and having a frequency that equals the frequency of the input clock signal;
   supplying the input clock signal to a T/4 delay generator circuit and generating a T/4 delay output signal that has a delay of T/4 from the DCC output signal, where T/4 corresponds to one quarter of a period of the input clock signal; and
   XORing the DCC output signal with the T/4 delay output signal to generate an output clock signal having a second frequency that is double the first frequency and has an output clock duty cycle of fifty percent.

2. The method as recited in claim 1 further comprising:
   supplying the input clock signal to a first delay line of the DCC circuit and generating a first delay line output signal;
   supplying the input clock signal to a second delay line of the DCC circuit and generating a second delay line output signal;
   dividing the first delay line output signal by two and generating a first divided output signal;
   dividing the second delay line output signal by two and generating a second divided output signal; and
   XORing the first divided output signal and the second divided output signal to generate the DCC output signal.

3. The method as recited in claim 2 comprising:
   supplying the input clock signal to a third delay line of the T/4 delay generator circuit and generating a third delay line output signal;
   supplying the input clock signal to a fourth delay line of the T/4 delay generator circuit and generating a fourth delay line output signal;
   dividing the third delay line output signal by two and generating a third divided output signal;
   dividing the fourth delay line output signal by two and generating a fourth divided output signal; and
   XORing the third divided output signal with the fourth divided output signal to generate the T/4 delay output signal having a frequency that is the same as that of the input clock signal.

4. The method as recited in claim 3, further comprising:
   dividing the first delay line output signal by two using a negative edge of the first delay line output signal; and
   dividing the second delay line output signal by two using a positive edge of the second delay line output signal.

5. The method as recited in claim 3, further comprising:
   supplying the DCC output signal and the T/4 delay output signal to a selector circuit; and
   selecting the DCC output signal or the T/4 delay output signal to be supplied from the selector circuit to a duty cycle estimator according to a select signal.

6. The method as recited in claim 5, further comprising:
   calibrating the DCC circuit including, setting respective delays of the first and second delay lines to be minimum;
selecting the DCC output signal to be supplied by the selector circuit to the duty cycle estimator; and
generating a duty cycle correction indication using the duty cycle estimator, the duty cycle correction indication to correct a duty cycle of the DCC output signal to fifty percent.

7. The method as recited in claim 6, further comprising:
calibrating the T/4 delay generator circuit after calibrating the DCC circuit, the calibrating of the T/4 delay generator circuit including,
setting respective delays of the third and fourth delay lines based on the duty cycle correction indication and a T/4 delay indication determined based on calibrating the DCC circuit, the T/4 delay indication indicative of a delay factor corresponding to one quarter of a period (T) of the input clock signal;
selecting the T/4 delay output signal to be supplied by the selector circuit to the duty cycle estimator; and
generating another T/4 delay indication and another duty cycle correction indication using the duty cycle estimator.

8. The method as recited in claim 5, further comprising:
determining a duty cycle correction indication using the duty cycle estimator and supplying the duty cycle correction indication to the second delay line of the DCC circuit to increase delay of the second delay line by a delay amount corresponding to the duty cycle correction indication, the duty cycle correction indication correcting a duty cycle of the DCC output signal to fifty percent.

9. The method as recited in claim 5, further comprising:
generating a duty cycle correction indication and a T/4 delay indication using the duty cycle estimator, the T/4 delay indication corresponding to one quarter of a period (T) of the input clock signal;
supplying the T/4 delay indication to the third delay line to set a delay for the third delay line; and
supplying the T/4 delay indication and the duty cycle correction indication to the fourth delay line to set a delay for the fourth delay line.

10. An apparatus for doubling a first frequency of an input clock signal comprising:
a duty cycle estimator, including a delay locked loop, to generate a duty cycle correction indication;
a duty cycle corrector circuit (DCC) to supply a DCC output signal with a duty cycle corrected to fifty percent, the DCC circuit coupled to receive the input clock signal and the duty cycle correction indication;
a T/4 delay generator circuit to supply a T/4 delay output signal that is delayed by T/4 from the DCC output signal, the T/4 delay generator circuit coupled to receive the input clock signal, where T/4 corresponds to one quarter of a period of the input clock signal; and
an XOR circuit to XOR the DCC output signal and the T/4 delay output signal to generate an output clock signal having a second frequency that is double the first frequency and has a fifty percent duty cycle.

11. The apparatus as recited in claim 10 wherein the duty cycle corrector circuit comprises:
a first delay line coupled to the input clock signal and generating a first delay line output signal;
a second delay line coupled to the input clock signal and generating a second delay line output signal; and
a first divide circuit to divide the first delay line output signal by two and generate a first divided output signal;
a second divide circuit to divide the second delay line output signal by two and generate a second divided output signal; and
a second XOR circuit to XOR the first divided output signal and the second divided output signal to generate the DCC output signal.

12. The apparatus as recited in claim 11 wherein the T/4 delay generator circuit further comprises:
a third delay line to supply a third delay line output signal and having a third delay line input coupled to the input clock signal;
a fourth delay line to supply a fourth delay line output signal and having a fourth delay line input coupled to the input clock signal;
a third divide circuit to divide the third delay line output signal by two and generate a third divided output signal;
a fourth divide circuit to divide the fourth delay line output signal by two and generate a fourth divided output signal; and
a third XOR circuit to XOR the third divided output signal and the fourth divided output signal to generate the T/4 delay output signal having a frequency that is the same as that of the input clock signal.

13. The apparatus as recited in claim 12,
wherein the first delay line output signal is divided by two using a negative edge of the first delay line output signal; and
wherein the second delay line output signal is divided by two using a positive edge of the second delay line output signal.

14. The apparatus as recited in claim 13, wherein the second delay line is coupled to receive a duty cycle correction indication to thereby generate a second delay line delay that includes a baseline delay amount associated with the second delay line and a second delay amount corresponding to the duty cycle correction indication, the duty cycle correction indication corresponding to a duty cycle error determined by the duty cycle estimator.

15. The apparatus as recited in claim 13,
wherein a T/4 indication corresponding to one quarter of a period (T) of the input clock signal is generated using the duty cycle estimator and the T/4 indication is supplied to increase delay of the third delay line by T/4; and
wherein the T/4 indication and a duty cycle correction indication are combined and supplied to the fourth delay line to increase delay of the fourth delay line by T/4 plus the duty cycle correction indication, the duty cycle correction indication corresponding to a duty cycle error determined by the duty cycle estimator.

16. The apparatus as recited in claim 12, further comprising:
a selector circuit to supply either the DCC output signal or the T/4 delay output signal to the duty cycle estimator according to a selection signal.

17. The apparatus as recited in claim 12, wherein the first, second, third and fourth delay lines comprise unit delay cells that include one or more delay elements and a multiplexer circuit to select an output from the one or more delay elements or an input from a previous unit delay cell.

18. The apparatus as recited in claim 16, wherein the apparatus is configured to calibrate the duty cycle correction circuit by selecting the DCC output signal to be supplied by the selector circuit to the duty cycle estimator, setting respective delays of the first and second delay lines to be equal; and determining any duty cycle error in the DCC output signal using the duty cycle estimator.

19. The apparatus as recited in claim 16, wherein the apparatus is configured to calibrate the T/4 delay generator circuit selecting the T/4 delay output signal to be supplied by the selector circuit to the duty cycle estimator, and determining a duty cycle correction indication and a T/4 delay indication using the duty cycle estimator.

20. A method for doubling a frequency of an input signal comprising:
   supplying the input signal to a duty cycle corrector (DCC) circuit and generating a DCC output signal;
   supplying the input signal to a T/4 delay generator circuit and generating a T/4 delay output signal;
   supplying the DCC output signal and the T/4 delay output signal to a selector circuit; and
   selecting the DCC output signal to be supplied to a duty cycle estimator and calibrating the DCC circuit and then selecting the T/4 delay output signal to be supplied to the duty cycle estimator and calibrating the T/4 delay generator circuit;
   after calibration of the DCC circuit and the T/4 delay generator circuit,
   supplying a duty cycle correction indication generated during calibration to the DCC circuit and generating a DCC output signal having a duty cycle corrected to a fifty percent duty cycle and having a frequency that equals the frequency of the input signal;
   supplying a T/4 indication and the duty cycle correction to the T/4 delay generator circuit and generating a T/4 delay output signal having a duty cycle corrected to fifty percent and having a delay of T/4 from the DCC output signal, where T/4 corresponds to one quarter of a period of the input signal, the T/4 delay output signal having a frequency that equals the frequency of the input signal; and
   XORing the T/4 delay output signal and the DCC output signal to generate an output signal having a frequency that is twice the frequency of the input signal and having a fifty percent duty cycle.

* * * * *